(12) United States Patent
Chu et al.

(10) Patent No.: US 8,975,674 B2
(45) Date of Patent: Mar. 10, 2015

(54) BRIDGE STRUCTURE

(71) Applicant: National Applied Research Laboratories, Taipei (TW)

(72) Inventors: Chun-Lin Chu, Hsinchu (TW); Shu-Han Hsu, Hsinchu (TW); Guang-Li Luo, Hsinchu (TW); Chee-Wee Liu, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 55 days.

(21) Appl. No.: 13/672,971

(22) Filed: Nov. 9, 2012

(65) Prior Publication Data

US 2014/0131768 A1    May 15, 2014

(51) Int. Cl.

| | |
|---|---|
| H01L 27/088 | (2006.01) |
| H01L 29/12 | (2006.01) |
| H01L 29/267 | (2006.01) |
| B82Y 10/00 | (2011.01) |
| H01L 29/06 | (2006.01) |
| H01L 29/66 | (2006.01) |
| H01L 29/775 | (2006.01) |
| H01L 29/32 | (2006.01) |
| H01L 29/49 | (2006.01) |
| H01L 29/51 | (2006.01) |

(52) U.S. Cl.
CPC ............ *H01L 29/0673* (2013.01); *B82Y 10/00* (2013.01); *H01L 29/32* (2013.01); *H01L 29/4966* (2013.01); *H01L 29/513* (2013.01); *H01L 29/66439* (2013.01); *H01L 29/775* (2013.01)
USPC ...... 257/288; 257/183; 257/190; 257/E27.06; 257/E29.068; 257/E29.081

(58) Field of Classification Search
USPC .......... 257/183, 190, 288, E29.068, E29.081, 257/E27.06
See application file for complete search history.

(56) References Cited

U.S. PATENT DOCUMENTS

| | | | | |
|---|---|---|---|---|
| 5,539,236 | A * | 7/1996 | Kurtz et al. ................... | 257/415 |
| 5,583,362 | A * | 12/1996 | Maegawa ...................... | 257/347 |
| 6,495,403 | B1 | 12/2002 | Skotnicki et al. | |
| 8,441,038 | B1 * | 5/2013 | Trimberger ................... | 257/209 |
| 8,557,686 | B1 * | 10/2013 | Zhu ............................... | 438/479 |
| 2002/0149031 | A1* | 10/2002 | Kim et al. ..................... | 257/192 |
| 2004/0253792 | A1* | 12/2004 | Cohen et al. .................. | 438/400 |
| 2007/0298551 | A1* | 12/2007 | Bouvet et al. ................. | 438/151 |
| 2009/0057648 | A1 | 3/2009 | Hudait et al. | |
| 2009/0065853 | A1 | 3/2009 | Hanafi | |
| 2010/0133617 | A1 | 6/2010 | Hanafi | |

(Continued)

OTHER PUBLICATIONS

Hsu, et al., "Nearly Defect-free Ge Gate-All-Around FETs on Si Substrates", Dec. 5, 2011, pp. 825-828, IEEE.

(Continued)

*Primary Examiner* — Victor A Mandala
(74) *Attorney, Agent, or Firm* — WPAT, PC; Justin King

(57) ABSTRACT

A bridge structure for use in a semiconductor device includes a semiconductor substrate and a semiconductor structure layer. The semiconductor structure layer is formed on a surface of the semiconductor substrate and a lattice difference is formed between the semiconductor structure layer and the semiconductor substrate. The semiconductor structure layer includes at least a first block, at least a second block and at least a third block, wherein the first block and the third block are bonded on the surface of the semiconductor substrate, the second block is floated over the semiconductor substrate and connected with the first block and the third block.

20 Claims, 15 Drawing Sheets

(56) References Cited

U.S. PATENT DOCUMENTS

2010/0317137 A1* 12/2010 Dupre et al. ............... 438/50
2011/0003446 A1* 1/2011 Lai et al. ............... 438/264
2011/0068407 A1 3/2011 Yeh et al.
2012/0289016 A1* 11/2012 Forbes ............... 438/299

OTHER PUBLICATIONS

Peng, et al., "CMOS Compatible Ge/Si Core/Shell Nanowire Gate-All-Around pMOSFET Integrated with HfO2/TaN Gate Stack", 2009, pp. 931-934, IEEE.

* cited by examiner

BRIDGE STRUCTURE

FIELD OF THE INVENTION

The present invention relates to a bridge structure, and particularly to a bridge structure for use in a semiconductor device.

BACKGROUND OF THE INVENTION

For increasing the response speed of the semiconductor device and reducing the power consumption, the use of a semiconductor material having high carrier mobility is a way to achieve the both functions. The semiconductor material having high carrier mobility includes for example germanium (Ge), alloy semiconductor material or compound semiconductor material. However, in a case that a semiconductor structure layer with a material different from a semiconductor substrate is stacked on the semiconductor substrate, some problems may occur. For example, the lattice size difference between the semiconductor substrate and the overlying semiconductor structure layer with the different material may cause dislocations in the semiconductor device. Due to the dislocations, the performance of the semiconductor device is deteriorated.

Conventionally, in order to fabricate a germanium-based semiconductor device including a silicon substrate, a thicker buffer layer or sacrificial layer (e.g. a silicon/germanium buffer layer) is formed on the silicon substrate, then a germanium epitaxial layer is grown on the silicon/germanium buffer layer, and then an anisotropic etching process and an isotropic etching process are sequentially performed to remove a part of the buffer layer and retain the germanium epitaxial layer.

Generally, in a case that the major material of the active region of a MOSFET is germanium, the MOSFET is referred as a germanium MOSFET. FIGS. 1A~1H schematically illustrate a partial process flow of fabricating a conventional germanium MOSFET.

Firstly, please refer to the cross-sectional view as shown in FIG. 1A. A silicon/germanium buffer layer 110, a germanium epitaxial layer 120 and a mask layer 130 are sequentially formed on a silicon substrate 100.

Next, please refer to the top view as shown in FIG. 1B. The mask layer 130 is patterned to expose a part of the germanium epitaxial layer 120. FIG. 1C is a schematic cross-sectional view illustrating the structure of FIG. 1B and taken along the line AA'. As shown in FIG. 1C, the silicon/germanium buffer layer 110, the germanium epitaxial layer 120 and the patterned mask layer 130 are sequentially formed on the silicon substrate 100.

Next, please refer to the cross-sectional view as shown in FIG. 1D. An anisotropic etching process is performed to remove an exposed part of the germanium epitaxial layer 120 by using the silicon/germanium buffer layer 110 as an etch stop layer. Consequently, a channel region 122 is formed.

Next, please refer to the cross-sectional view as shown in FIG. 1E. A protecting layer 140 is formed over the remaining germanium epitaxial layer 120 to protect the sidewall of the channel region 122. Then, an isotropic etching process is performed to remove the silicon/germanium buffer layer 110 between the silicon substrate 100 and the channel region 122. Consequently, the channel region 122 is floated over the silicon substrate 100.

Next, please refer to the cross-sectional view as shown in FIG. 1F. After the protecting layer 140 and the patterned mask layer 130 are removed, an active region 120a of the germanium MOSFET is formed in the remaining germanium epitaxial layer 120. The active region 120a is divided into a source region 121, the channel region 122 and a drain region 123. FIG. 1G is a schematic cross-sectional view illustrating the structure of FIG. 1F and taken along the line AA'. As shown in FIG. 1G, the channel region 122 is floated over the surface of the silicon substrate 100. FIG. 1H is a schematic cross-sectional view illustrating the structure of FIG. 1F and taken along the line BB'. As shown in FIG. 1H, the source region 121 and the drain region 123 are bonded on the surface of the remaining silicon/germanium buffer layer 110, and the channel region 122 is floated over the surface of the silicon substrate 10 and connected with the source region 121 and the drain region 123.

Although the semiconductor structure layer with the different material can be stacked on the semiconductor substrate to fabricate a semiconductor device, the above method of fabricating the semiconductor device is complicated. Moreover, the above fabricating method fails to effectively eliminate the dislocations (not shown) in the semiconductor device.

Therefore, there is a need of providing an approach to eliminate the above drawbacks.

SUMMARY OF THE INVENTION

An aspect of the present invention provides a bridge structure for use in a semiconductor device. The bridge structure includes a semiconductor substrate and a semiconductor structure layer. The semiconductor structure layer is formed on a surface of the semiconductor substrate and a lattice difference is formed between the semiconductor structure layer and the semiconductor substrate. The semiconductor structure layer includes at least a first block, at least a second block and at least a third block, wherein the first block and the third block are bonded on the surface of the semiconductor substrate, the second block is floated over the semiconductor substrate and connected with the first block and the third block.

Another aspect of the present invention provides a bridge structure for a semiconductor device. The bridge structure includes a silicon substrate and a germanium structure. The germanium structure is divided into a first block, a second block and a third block. The first block and the third block are bonded on a surface of the silicon substrate, and the second block is floated over the silicon substrate and connected with the first block and the third block.

Another aspect of the present invention provides a semiconductor device structure. The semiconductor device structure includes a semiconductor substrate and a semiconductor structure layer. The semiconductor structure layer is formed on a surface of the semiconductor substrate and a lattice difference is formed between the semiconductor structure layer and the semiconductor substrate. The semiconductor structure layer includes at least a first block, at least a second block and at least a third block. The first block and the third block are bonded on the surface of the semiconductor substrate. The second block is floated over the semiconductor substrate and connected with the first block and the third block. The second block has a cross section with a specified profile floated over the silicon substrate, wherein the specified profile of the cross section, which is perpendicular to an axial direction of the second block connected with the first block and the third block, is gradually decreased from top to bottom, and a length of the cross section perpendicular to a surface of the silicon substrate is smaller than 50 nm.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 2A~2M schematically illustrate a partial process flow of a bridge structure fabricating method according to a first embodiment of the present invention. The bridge structure fabricating method is applied to the process of producing a germanium MOSFET.

Figure 1A:
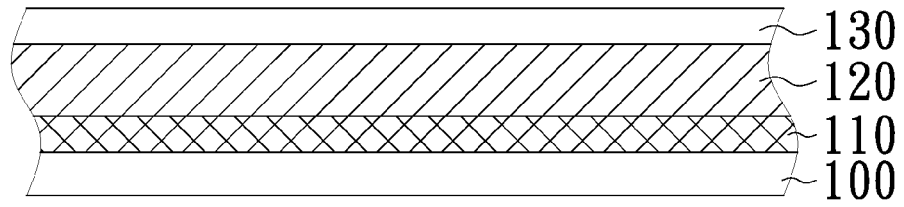
FIGS. 1A~1H schematically illustrate a partial process flow of fabricating a conventional germanium MOSFET.
Figure 1B:
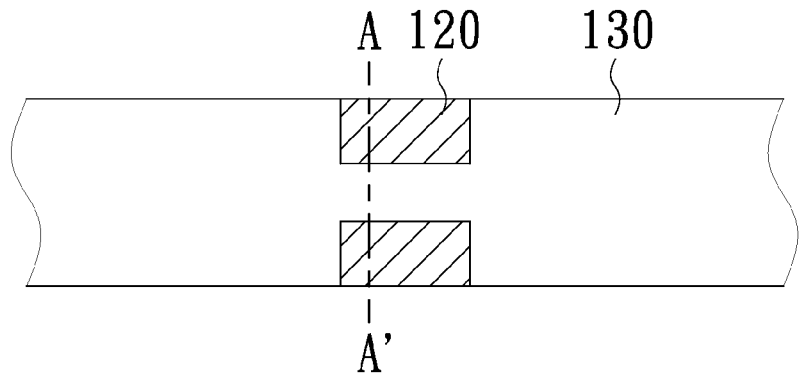
Figure 1C:
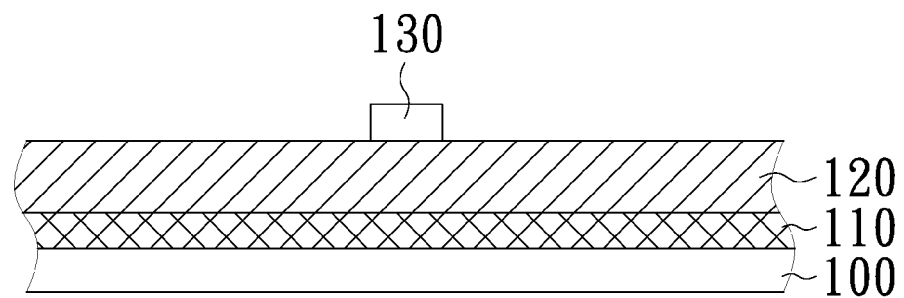
Figure 1D:
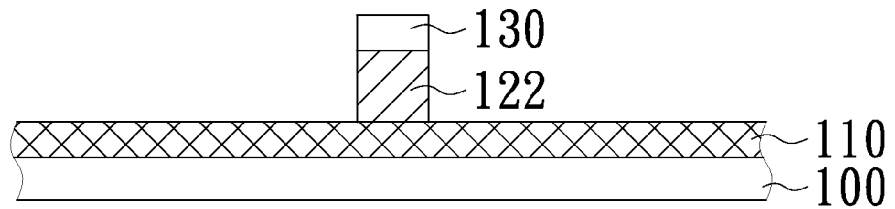
Figure 1E:
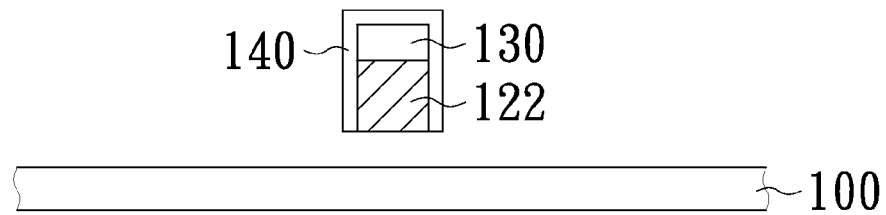
Figure 1F:
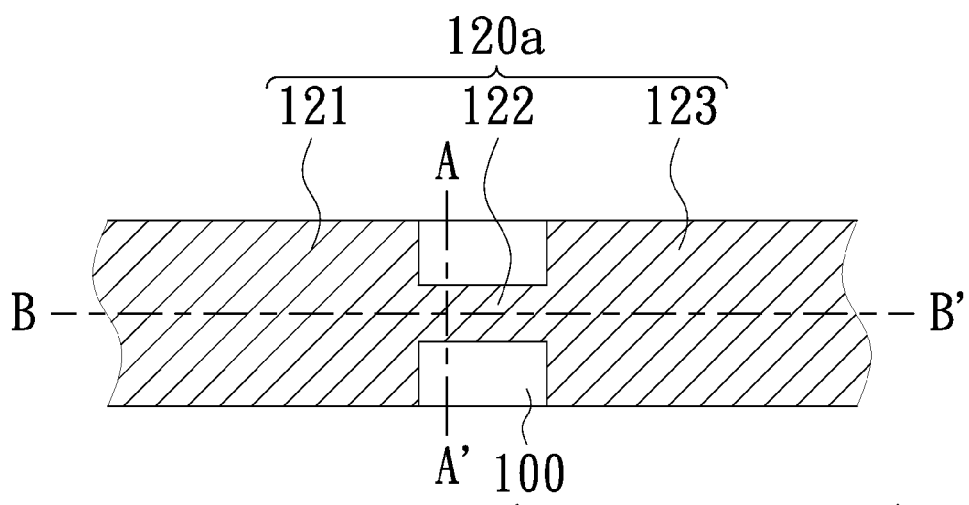
Figure 1G:
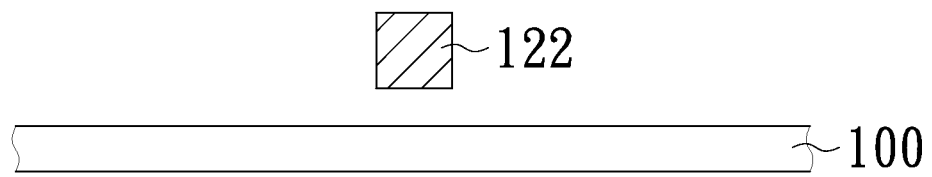
Figure 1H:
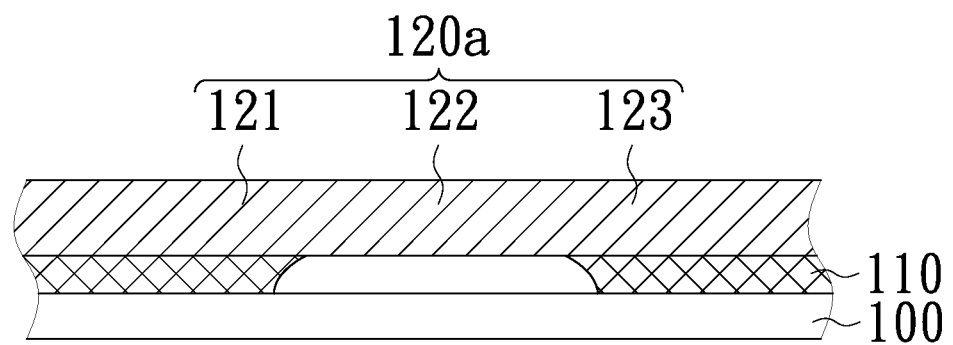
Figure 2A:
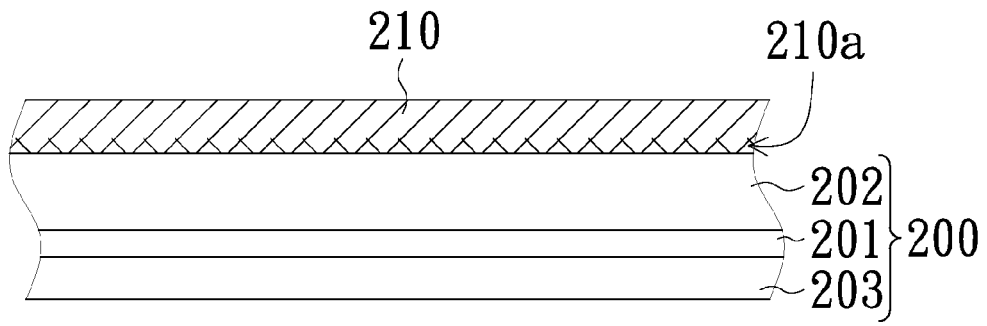
FIGS. 2A~2M schematically illustrate a bridge structure according to a first embodiment of the present invention.

Firstly, please refer to the cross-sectional view as shown in FIG. 2A. A silicon substrate 200 such as a silicon-on-insulator (SOI) substrate is provided. The silicon-on-insulator substrate 200 comprises a silicon substrate base 203, a silicon dioxide layer 201, and a monocrystalline silicon layer 202. Moreover, a germanium epitaxial layer 210 is formed on the surface of the monocrystalline silicon layer 202. Because of 4.2% lattice mismatch between silicon and germanium, a misfit dislocation region 210a is formed at the interface between the monocrystalline silicon layer 202 and the germanium epitaxial layer 210. In this context, the misfit dislocation region 210a is also referred as a defective region. It is noted that the silicon substrate 200 is not limited to the silicon-on-insulator substrate. Alternatively, in some embodiments the silicon substrate 200 may be a bulk silicon substrate, a P-type extrinsic semiconductor substrate, an N-type extrinsic semiconductor substrate or an intrinsic semiconductor substrate. Optionally, after the germanium epitaxial layer 210 is formed, a rapid thermal annealing (RTA) process or a cyclic annealing process including multiple continuous rapid thermal annealing processes may be performed to eliminate the threading dislocation (not shown) in the germanium epitaxial layer 210.

Figure 2B:
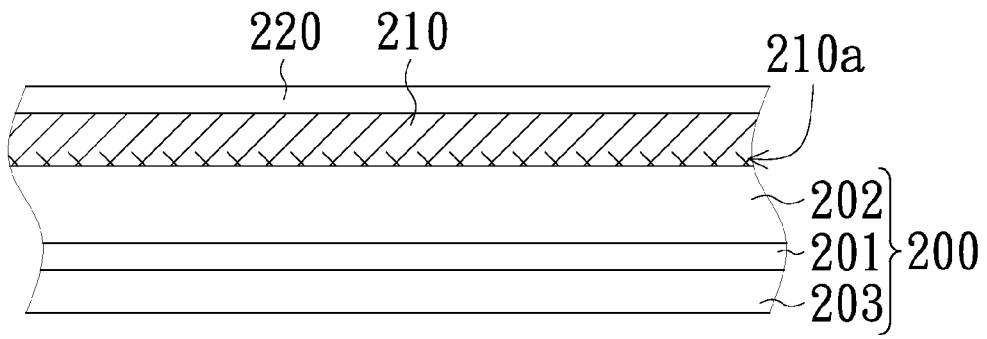

Then, please refer to the cross-sectional view as shown in FIG. 2B. After a photoresist layer is formed on the germanium epitaxial layer 210, a patterning process (e.g. a mask lithography process or an electron-beam lithography process) is performed to form a photoresist mask 220. It is noted that the patterning process is not limited to the mask lithography process or the electron-beam lithography process.

Figure 2C:
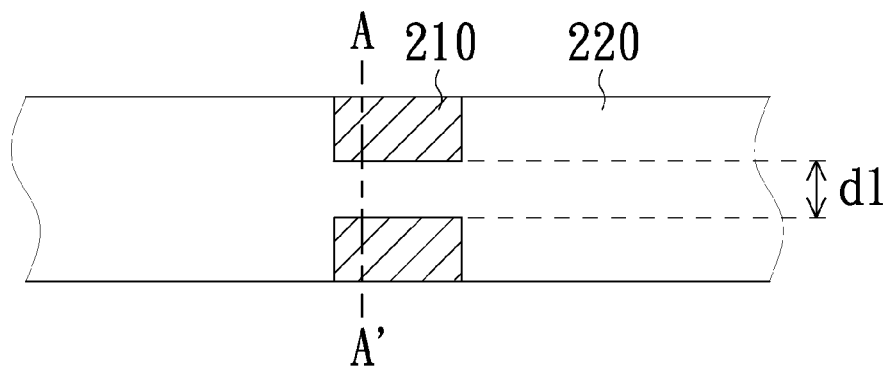
Figure 2D:
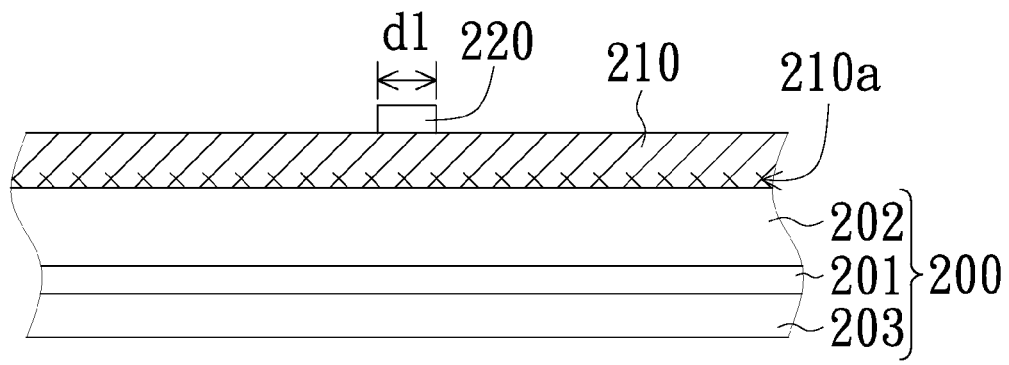

Next, please refer to the top view as shown in FIG. 2C. After the photoresist mask 220 is formed, a part of the germanium epitaxial layer 210 is exposed. The photoresist mask 220 has a width d1 along the line AA'. FIG. 2D is a schematic cross-sectional view illustrating the structure of FIG. 2C and taken along the line AA'. As shown in FIG. 2D, the germanium epitaxial layer 210 with the defective region 210a, the photoresist mask 220 with the width d1 are sequentially formed over the silicon substrate 200.

Figure 2E:
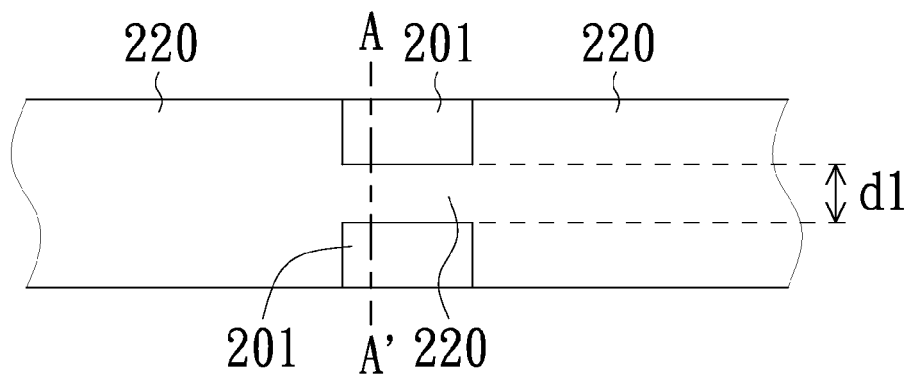
Figure 2F:
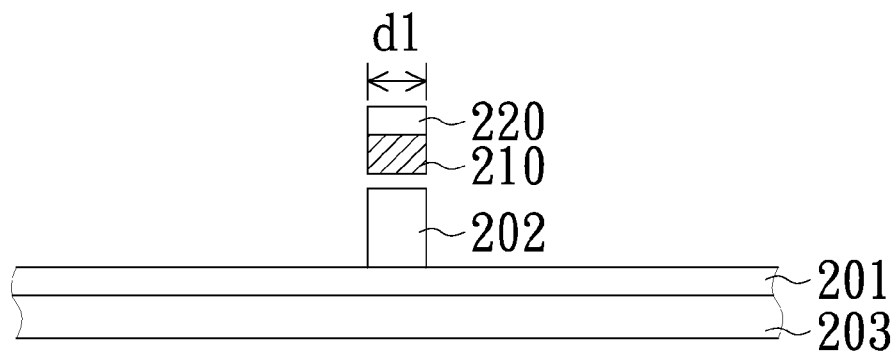

Next, please refer to the top view as shown in FIG. 2E. An anisotropic etching process is performed to remove a part of the germanium epitaxial layer including the defective region. Then, a part of the monocrystalline silicon layer 202 is removed to partially expose the silicon dioxide layer 201. FIG. 2F is a schematic cross-sectional view illustrating the structure of FIG. 2E and taken along the line AA'. By using the silicon dioxide layer 201 as an etch stop layer, an etching process is performed to sequentially remove a part of the germanium epitaxial layer including the defective region and a part of the monocrystalline silicon layer. The crystalline strength of the misfit dislocation region (i.e. the defective region) is very weak. During the process of etching the part of the germanium epitaxial layer uncovered by the photoresist mask 220, the defective region is also removed easily. In this embodiment, a single anisotropic plasma etching process is performed to remove a part of the germanium epitaxial layer including the defective region and a part of the monocrystalline silicon layer.

Figure 2G:
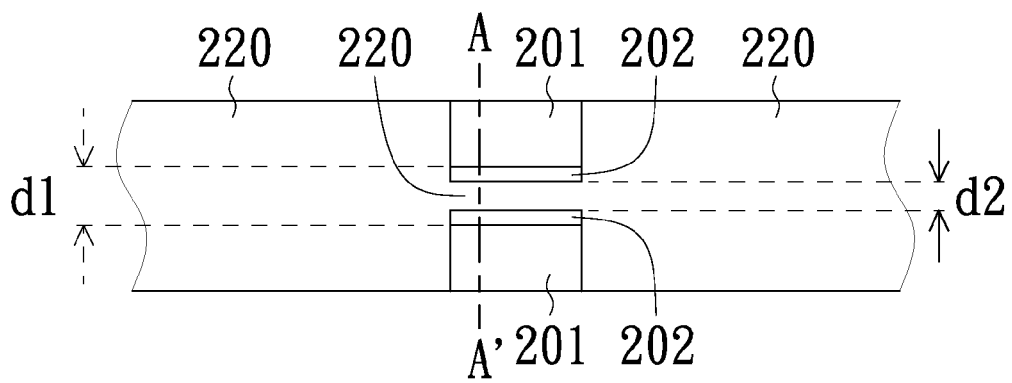
Figure 2H:
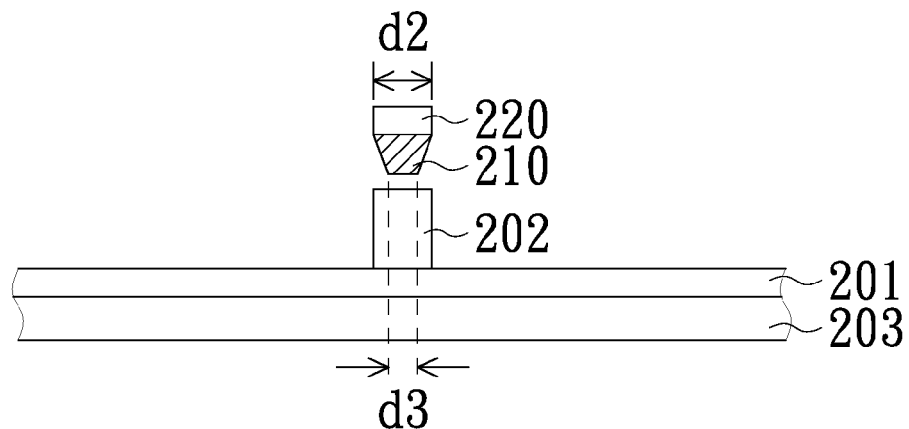

Next, please refer to the top view as shown in FIG. 2G. By adjusting the bias power of the anisotropic plasma etching process, the vertical etching speed and the horizontal etching speed can be effectively controlled. Consequently, during the etching process, the width of the photoresist mask 220 along the line AA' is gradually decreased from d1 (as is indicated by a dashed arrow) to d2. In this embodiment, the etching rate of the germanium epitaxial layer 210 is higher than the etching rate of the monocrystalline silicon layer 202. Consequently, after the width of the photoresist mask 220 along the line AA' is gradually decreased from d1 to d2, a part of the remaining monocrystalline silicon layer 202 is gradually exposed. FIG. 2H is a schematic cross-sectional view illustrating the structure of FIG. 2G and taken along the line AA'. After the germanium epitaxial layer 210 is further partially removed, the cross section of the remaining germanium epitaxial layer 210 has a trapezoid profile whose top is wide and bottom is narrow. As shown in FIG. 2H, the top of the trapezoid profile in parallel with the surface of the remaining monocrystalline silicon layer 202 has a width d2, and the bottom of the trapezoid profile in parallel with the surface of the remaining monocrystalline silicon layer 202 has the width d3, wherein the width d3 is smaller than the width d2.

Figure 2I:
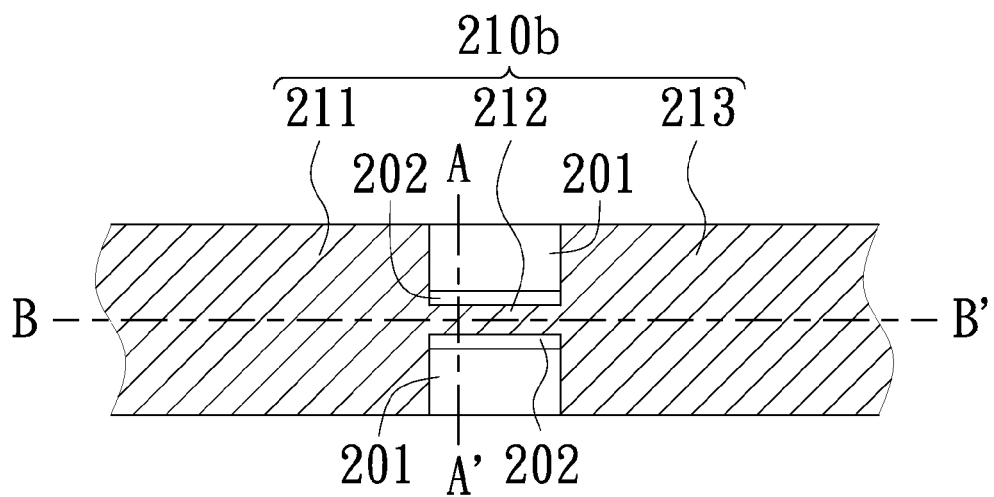

Next, please refer to the top view as shown in FIG. 2I. After the anisotropic etching process is completed, the remaining germanium epitaxial layer is formed as a bridge structure 210b. The bridge structure 210b is divided into a source region block 211, a channel region block 212 and a drain region block 213. Optionally, after the bridge structure 210b is formed, a rapid thermal annealing process or a cyclic annealing process including multiple continuous rapid thermal annealing processes may be performed to eliminate the threading dislocation (not shown) in the bridge structure 210b.

Figure 2J:
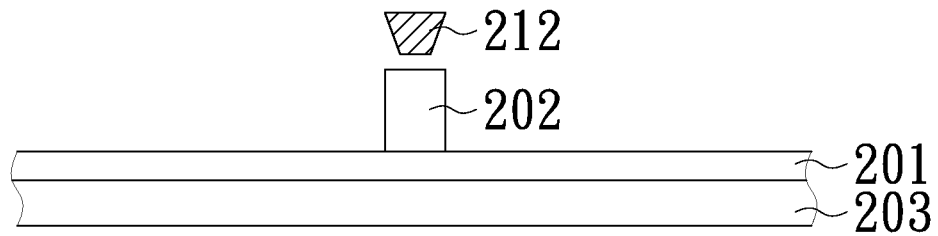
Figure 2K:
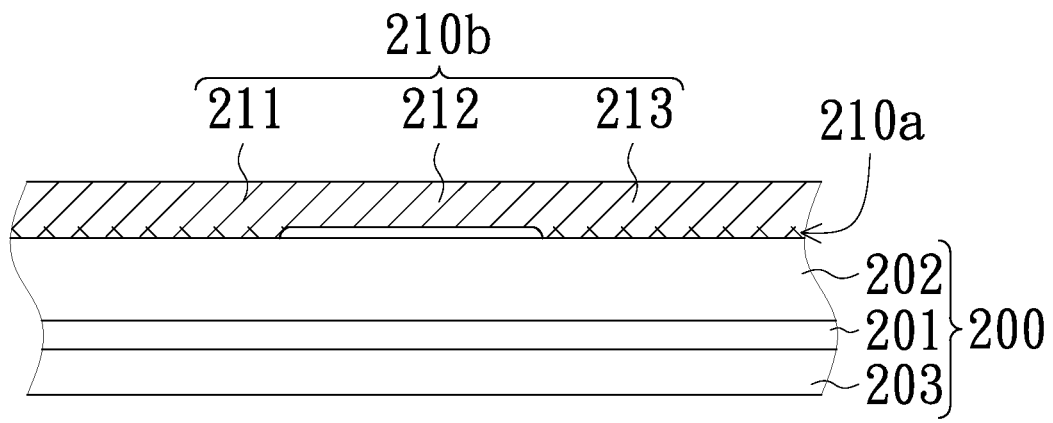

FIG. 2J is a schematic cross-sectional view illustrating the structure of FIG. 2I and taken along the line AA'. As mentioned above, the crystalline strength of the defective region is very weak. After a single anisotropic plasma etching process is performed to remove a part of the germanium epitaxial layer including the defective region, the channel region block 212 with a specified-profile cross section is floated over the exposed part of the remaining monocrystalline silicon layer 202. Moreover, by adjusting the bias power of the anisotropic plasma etching process, the vertical etching speed and the horizontal etching speed are both effectively controlled. Consequently, the cross section of the channel region block 212 has a trapezoid profile. FIG. 2K is a schematic cross-sectional view illustrating the structure of FIG. 2I and taken along the line BB'. As shown in FIG. 2K, the silicon substrate 200 comprises the silicon substrate base 203, the silicon dioxide layer 201, and the remaining monocrystalline silicon layer 202. The bridge structure 210b comprises the source region block 211, the channel region block 212 and the drain region block 213. The source region block 211 and the drain region block 213 are bonded on the surface of the remaining monocrystalline silicon layer 202. The channel region block 212 is floated over the exposed part of the remaining monocrystalline silicon layer 202. In addition, the channel region block 212 is connected with the source region block 211 and the drain region block 213.

Figure 2L:
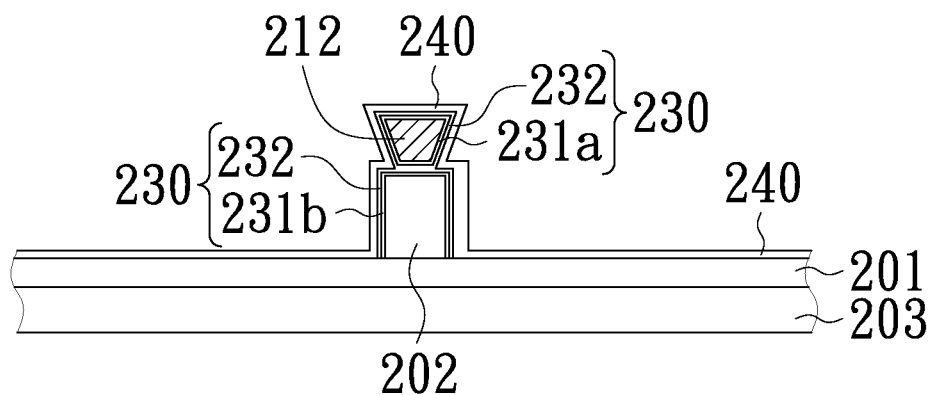

Next, please refer to the cross-sectional view as shown in FIG. 2L. After the structure of FIG. 2J is formed, an insulation structure 230 is formed to cover the bridge structure. In FIG. 2L, only the channel region block 212 of the bridge structure is shown. Then, a conductive material layer 240 is formed to cover the insulation structure 230. In this embodiment, the insulation structure 230 comprises a first insulation layer 231 and a second insulation layer 232. The first insulation layer 231 comprises a germanium dioxide layer 231a and a silicon dioxide layer 231b. By a thermal oxidation process, the germanium dioxide layer 231a is grown on the surface of the bridge structure 210b, and the silicon dioxide layer 231b is grown on the surface of the exposed part of the remaining monocrystalline silicon layer 202. Moreover, for forming the second insulation layer 232, an atomic layer deposition process is performed to deposit an aluminum oxide ($Al_2O_3$) layer to cover the first insulation layer 231. For forming the conductive material layer 240, a physical vapor deposition process is performed to deposit a titanium nitride (TiN) layer on the insulation structure 230.

Figure 2M:
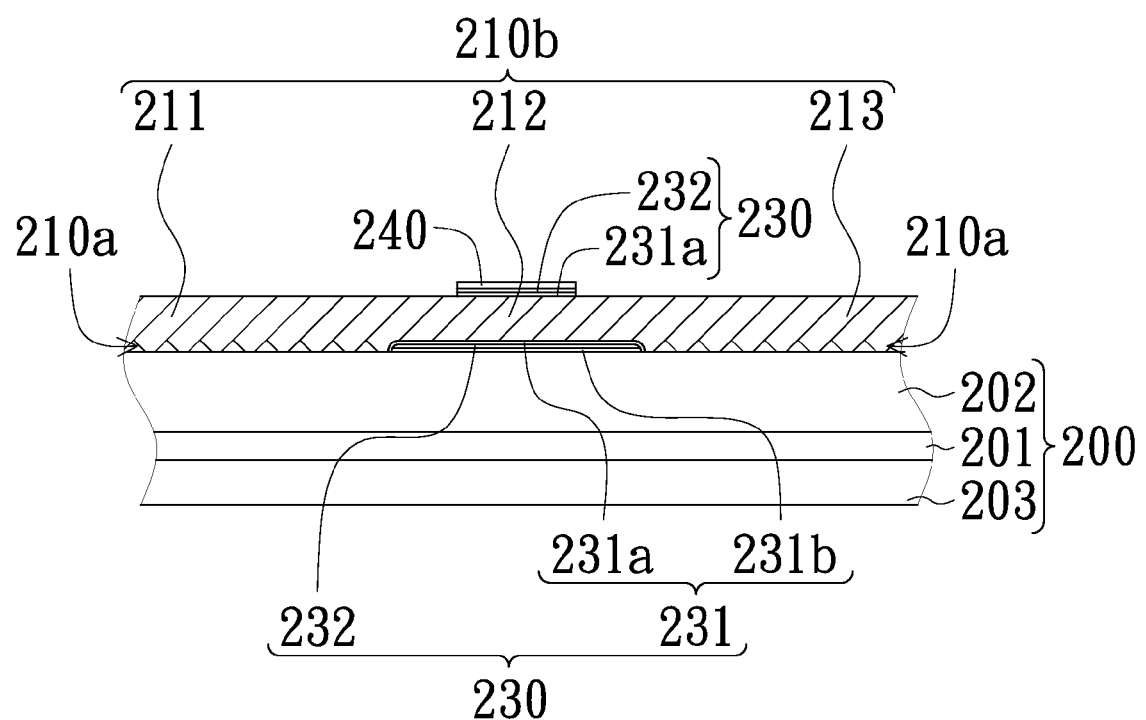

Next, please refer to the cross-sectional view as shown in FIG. 2M. After the structure of FIG. 2K is formed and the conductive material layer 240 is formed to cover the insulation structure 230 (see FIG. 2L), a part of the conductive material layer and a part of the insulation structure are sequentially removed to expose a part of the bridge structure 210b. Then, an ion implantation process is performed to dope the exposed part of the bridge structure 210b, and an annealing process is performed to treat the exposed part of the bridge structure 210b. Consequently, a fin-gate germanium MOSFET is produced.

Figure 3A:
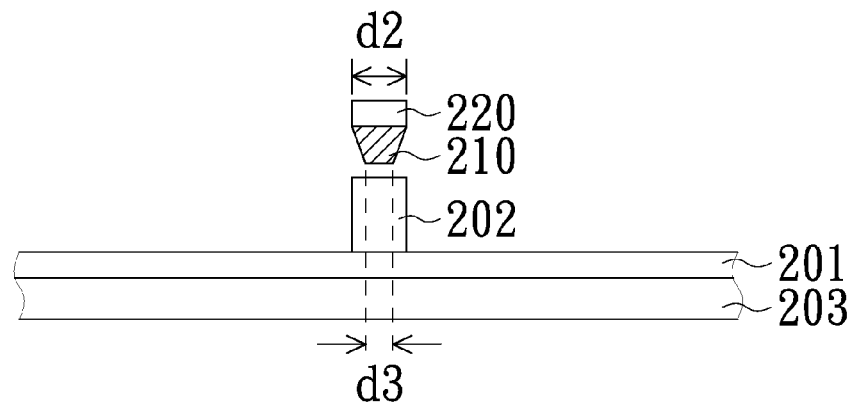
FIGS. 3A~3C schematically illustrate a bridge structure according to a second embodiment of the present invention.
Figure 3B:
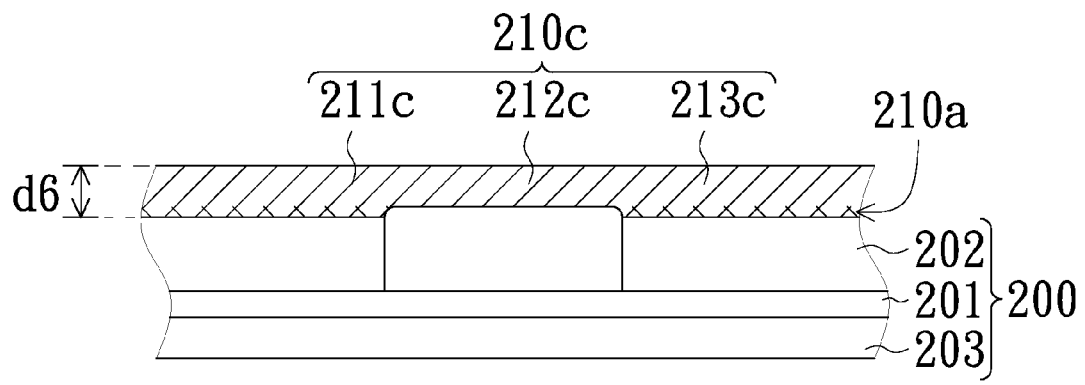
Figure 3C:
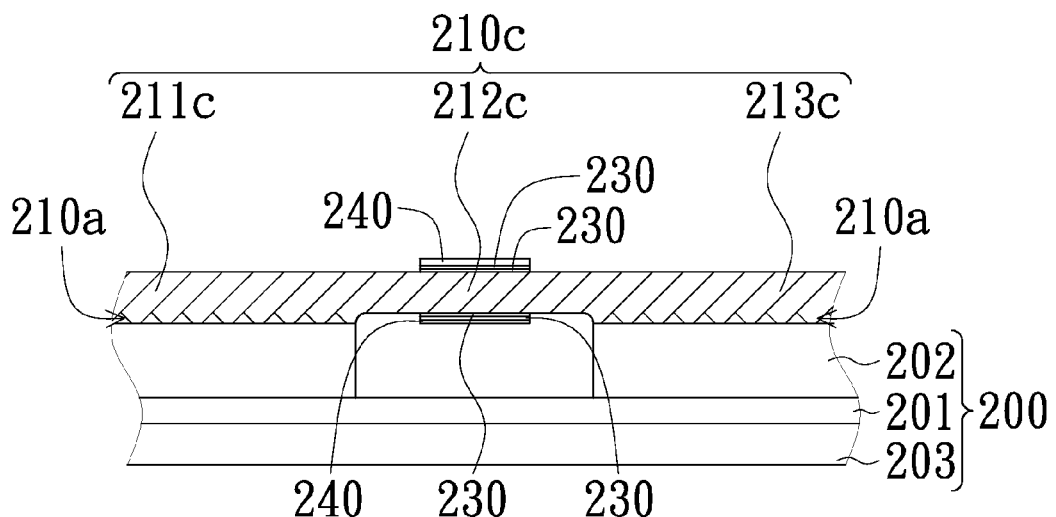

FIGS. 3A~3C schematically illustrate a partial process flow of a bridge structure fabricating method according to a second embodiment of the present invention. The bridge structure fabricating method is applied to the process of producing a germanium MOSFET.

In this embodiment, the front-end steps are similar to those as shown in FIGS. 2A~2G, and are not redundantly described herein. Firstly, please refer to FIG. 3A. FIG. 3A is a schematic cross-sectional view illustrating the structure of FIG. 2H. After the germanium epitaxial layer 210 is partially removed by the anisotropic etching process, the cross section of the remaining germanium epitaxial layer 210 has a trapezoid profile whose top is wide and bottom is narrow. That is, the top of the trapezoid profile in parallel with the surface of the remaining monocrystalline silicon layer 202 has a width d2, and the bottom of the trapezoid profile in parallel with the surface of the remaining monocrystalline silicon layer 202 has the width d3, wherein the width d3 is smaller than the width d2.

By adjusting the bias power of the anisotropic etching process to control the vertical etching speed and the horizontal etching speed while continuously performing the anisotropic etching process, the remaining monocrystalline silicon layer 202 underlying the remaining germanium epitaxial layer 210 is completely removed. FIG. 3B is a schematic cross-sectional view illustrating the structure taken along the same viewpoint as FIG. 2K. After the anisotropic etching process is completed, the remaining germanium epitaxial layer is formed as a bridge structure 210c. The bridge structure 210c is divided into a source region block 211c, a channel region block 212c and a drain region block 213c. The source region block 211c and the drain region block 213c are bonded on the surface of the remaining monocrystalline silicon layer 202c. Since the monocrystalline silicon layer underlying the channel region block 212c is completely removed, the silicon dioxide layer 201 is exposed. Moreover, as shown in FIG. 3B, the length d6 of the channel region block 212c perpendicular to the surface of the silicon-on-insulator substrate 200 may be decreased to 50 nm or less. Under this circumstance, the channel region block 212c may be considered as a nano-wire structure.

FIG. 3C is a schematic cross-sectional view illustrating the structure taken along the same viewpoint as FIG. 2M. After the structure of FIG. 3B is formed, an insulation structure 230 is formed to cover the bridge structure 210c. Then, a conductive material layer 240 is formed to cover the insulation structure 230. Consequently, a nano-wire germanium MOSFET is produced.

FIGS. 4A~4J schematically illustrate a partial process flow of a bridge structure fabricating method according to a third embodiment of the present invention. The bridge structure fabricating method is applied to the process of producing a germanium MOSFET.

Figure 4A:
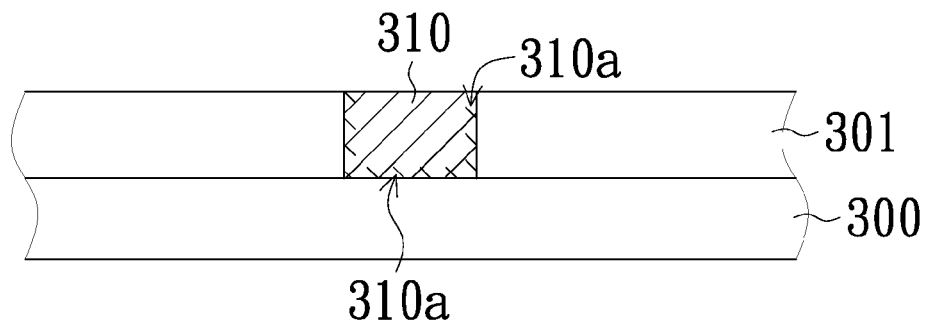
FIGS. 4A~4J schematically illustrate a bridge structure according to a third embodiment of the present invention.

Firstly, please refer to the cross-sectional view as shown in FIG. 4A. A silicon substrate 300 is provided, and a silicon dioxide layer 301 is formed on the surface of the silicon substrate 300. Then, a part of the silicon dioxide layer 301 is removed, so that a part of the silicon substrate 300 is exposed. Then, a germanium epitaxial layer 310 is grown on the surface of the exposed part of the silicon substrate 300. Because of the lattice mismatch between silicon and germanium, a misfit dislocation region 310a is formed at the interface between the germanium epitaxial layer 310 and the silicon dioxide layer 301.

Figure 4B:
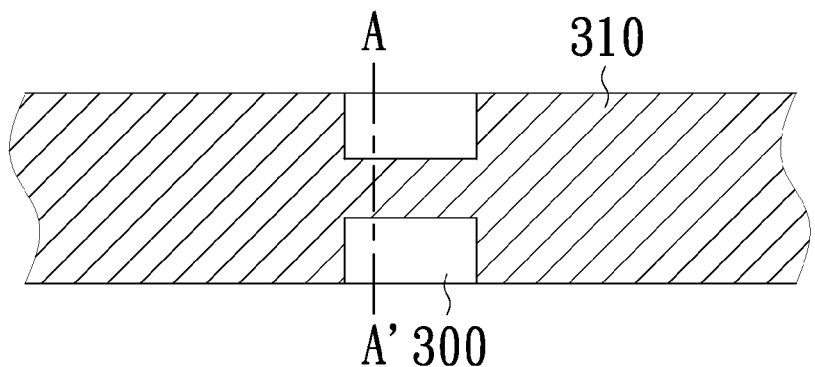
Figure 4C:
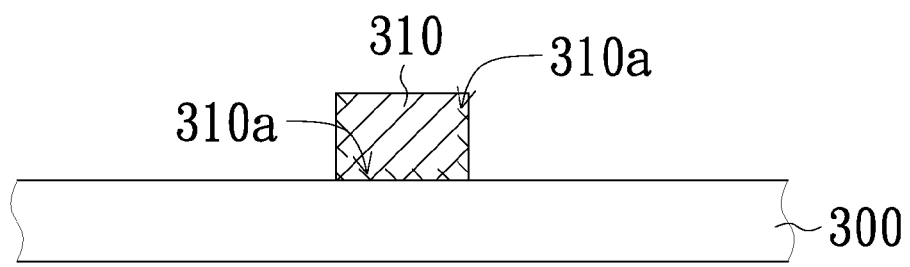

Next, please refer to the top view as shown in FIG. 4B. After the remaining silicon dioxide layer 301 is removed, a part of the silicon substrate 300 is exposed. FIG. 4C is a schematic cross-sectional view illustrating the structure of FIG. 4B and taken along the line AA'. The germanium epitaxial layer 310 includes the defective region 310a. Optionally, after the remaining silicon dioxide layer 301 is removed, a rapid thermal annealing process or a cyclic annealing process including multiple continuous rapid thermal annealing processes may be performed to eliminate the threading dislocation (not shown) in the germanium epitaxial layer 310.

Figure 4D:
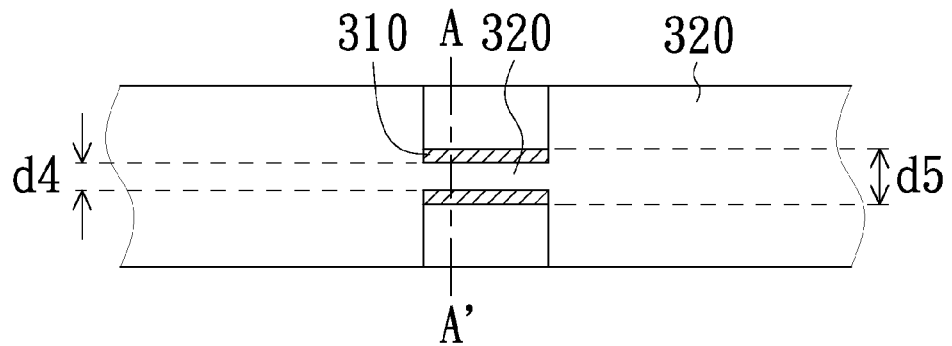
Figure 4E:
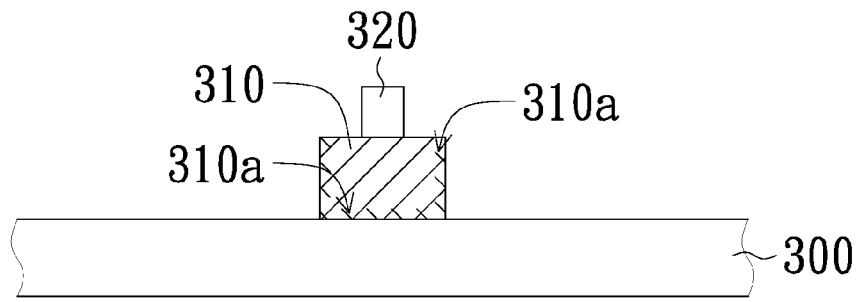

Next, please refer to the top view as shown in FIG. 4D. A photoresist mask 320 is formed on the germanium epitaxial layer 310. FIG. 4E is a schematic cross-sectional view illustrating the structure of FIG. 4D and taken along the line AA'. After the photoresist mask 320 is formed, an anisotropic etching process is performed to remove a part of the germanium epitaxial layer including the defective region. Moreover, as shown in FIG. 4D, a width d5 of the photoresist mask 320 along the line AA' is smaller than the width d4 of the germanium epitaxial layer 310 along the line AA'.

Figure 4F:
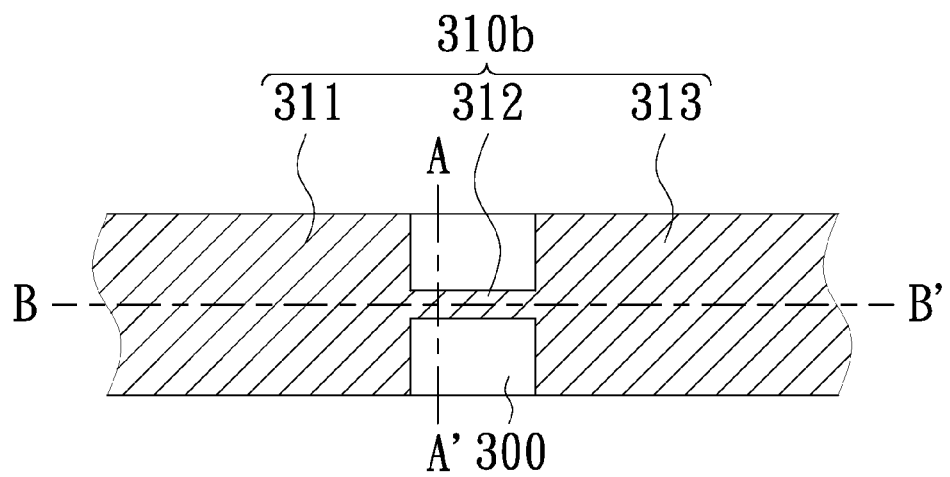
Figure 4G:
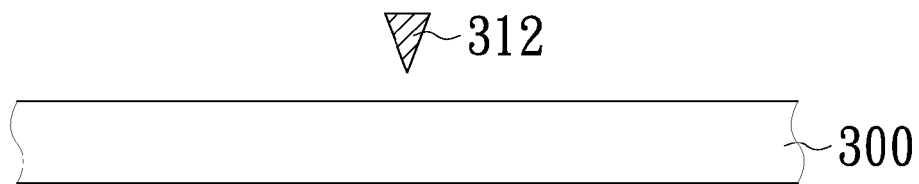
Figure 4H:
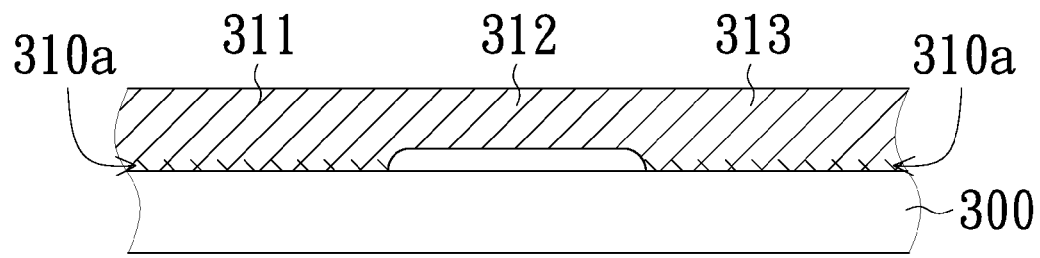

Next, please refer to the top view as shown in FIG. 4F. After the anisotropic etching process is completed, the remaining germanium epitaxial layer is formed as a bridge structure 310b. The bridge structure 310b is divided into a source region block 311, a channel region block 312 and a drain region block 313. Optionally, after the bridge structure 310b is formed, a rapid thermal annealing process or a cyclic annealing process including multiple continuous rapid thermal annealing processes may be performed to eliminate the threading dislocation (not shown) in the bridge structure 310b. FIG. 4G is a schematic cross-sectional view illustrating the structure of FIG. 4F and taken along the line AA'. As mentioned above, the crystalline strength of the defective region is very weak. After a single anisotropic etching process is performed to remove a part of the germanium epitaxial layer including the defective region, the channel region block 312 with a specified-profile cross section is floated over the exposed part of the silicon substrate 300. In this embodiment, the cross section of the channel region block 312 has an inverted triangular profile. FIG. 4H is a schematic cross-sectional view illustrating the structure of FIG. 4F and taken along the line BB'. As shown in FIG. 4H, the source region block 311 and the drain region block 313 are bonded on the surface of the silicon substrate 300. The channel region block 312 is floated over the exposed part of the silicon substrate 300. In addition, the channel region block 312 is connected with the source region block 311 and the drain region block 313.

Figure 4I:
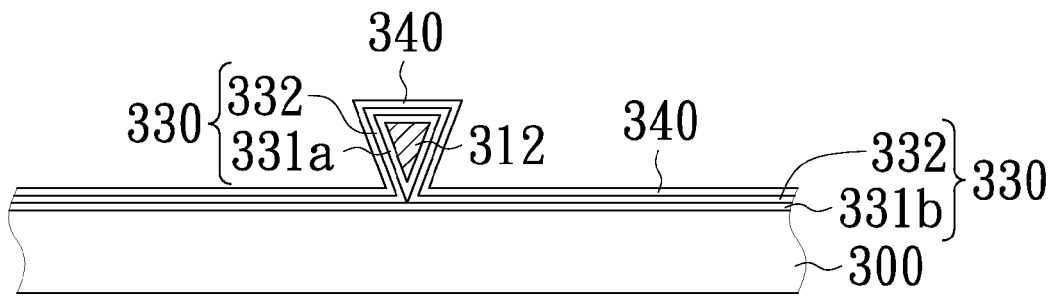

Next, please refer to the cross-sectional view as shown in FIG. 4I. After the structure of FIG. 4G is formed, an insulation structure 330 is formed to cover the bridge structure. In FIG. 4I, only the channel region block 312 of the bridge structure is shown. Then, a conductive material layer 340 is formed to cover the insulation structure 330. In this embodiment, the insulation structure 330 comprises a first insulation layer 331 and a second insulation layer 332. The first insulation layer 331 comprises a germanium dioxide layer 331a and a silicon dioxide layer 331b. By a thermal oxidation process, the germanium dioxide layer 331a is grown on the surface of the bridge structure 310b, and the silicon dioxide layer 331b is grown on the surface of the exposed part of the silicon substrate 300. Moreover, for forming the second insulation layer 332, an atomic layer deposition process is performed to deposit an aluminum oxide ($Al_2O_3$) layer to cover the first insulation layer 331. For forming the conductive material layer 340, a physical vapor deposition process is performed to deposit a titanium nitride (TiN) layer on the insulation structure 330.

Figure 4J:
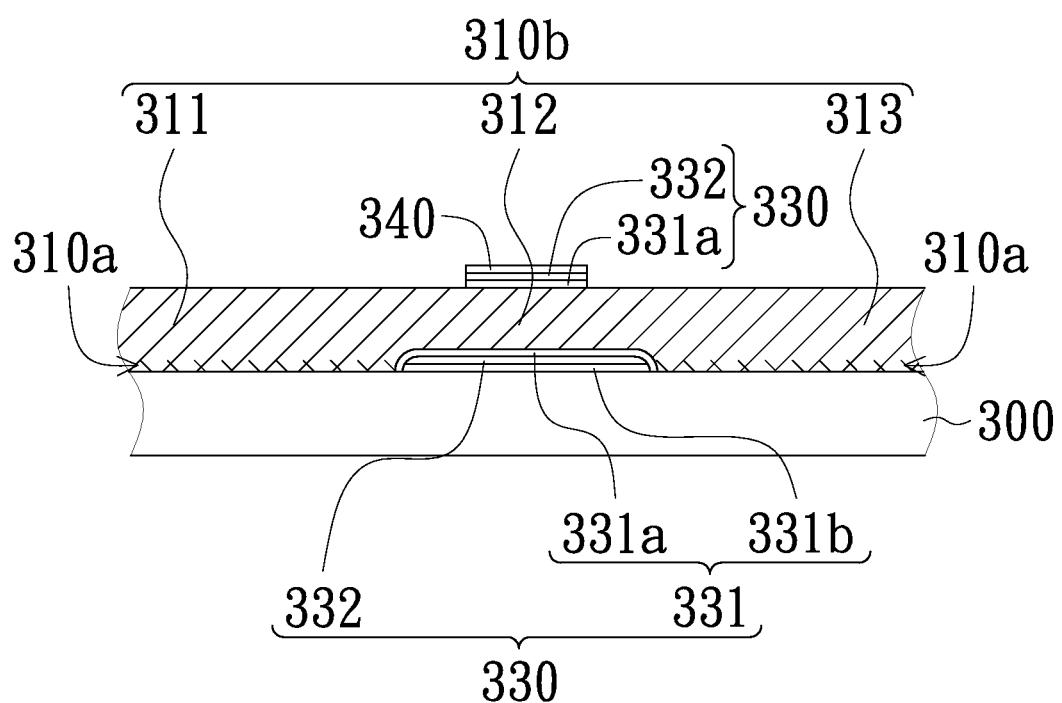

Next, please refer to the cross-sectional view as shown in FIG. 4J. After the structure of FIG. 4H is formed and the conductive material layer 340 is formed to cover the insulation structure 330 (see FIG. 4I), a part of the conductive material layer and a part of the insulation structure are sequentially removed to expose a part of the bridge structure 310b. Then, an ion implantation process is performed to dope the exposed part of the bridge structure 310b, and an annealing process is performed to treat the exposed part of the bridge structure 310b. Consequently, a gate-all-around germanium MOSFET is produced.

Figure 5:
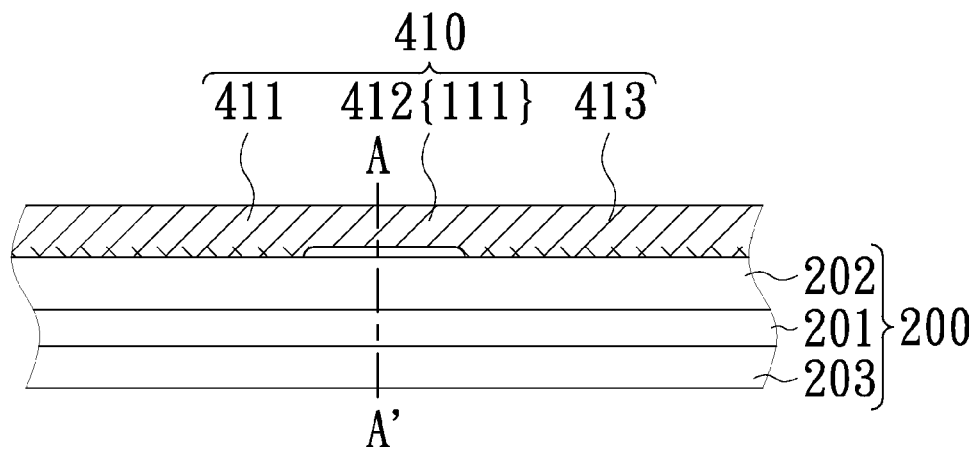
FIG. 5 is a schematic cross-sectional view illustrating an exemplary bridge structure for a germanium MOSFET.

FIG. 5 is a schematic cross-sectional view illustrating an exemplary bridge structure for a germanium MOSFET. The bridge structure comprises a silicon substrate 200 (e.g. a silicon-on-insulator substrate) and a germanium epitaxial layer 410. The silicon-on-insulator substrate 200 comprises a silicon substrate base 203, a silicon dioxide layer 201, and a monocrystalline silicon layer 202. The germanium epitaxial layer 410 comprises the source region block 411, the channel region block 412 and the drain region block 413. The source region block 411 and the drain region block 413 are bonded on the surface of the remaining monocrystalline silicon layer 202. The channel region block 412 is floated over the exposed part of the remaining monocrystalline silicon layer 202. In addition, the channel region block 412 is connected with the source region block 411 and the drain region block 413. It is noted that the silicon substrate 200 is not limited to the silicon-on-insulator substrate. Alternatively, in some embodiments, the silicon substrate 200 may be a bulk silicon substrate, a P-type extrinsic semiconductor substrate, an N-type extrinsic semiconductor substrate or an intrinsic semiconductor substrate. In this embodiment, a sidewall of the channel region block 412 has a {111} germanium crystallographic surface. In such way, the germanium MOSFET has excellent electric properties.

Figure 6:
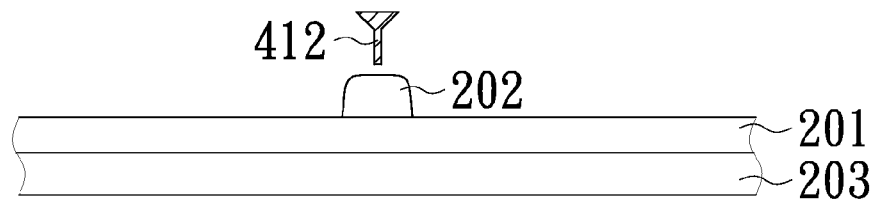
FIG. 6 is a schematic cross-sectional view illustrating the structure of FIG. 5 and taken along the line AA'.

FIG. 6 is a schematic cross-sectional view illustrating the structure of FIG. 5 and taken along the line AA'. The channel region block 412 has a cross section with a specified profile, and the channel region block 412 is floated over the monocrystalline silicon layer 202. The specified profile has a width is in parallel with the surface of the monocrystalline silicon layer 202, wherein from a top to a bottom of the specified profile, the width is gradually decreased. In this embodiment, the specified profile has a T-letter shape.

Figure 7:
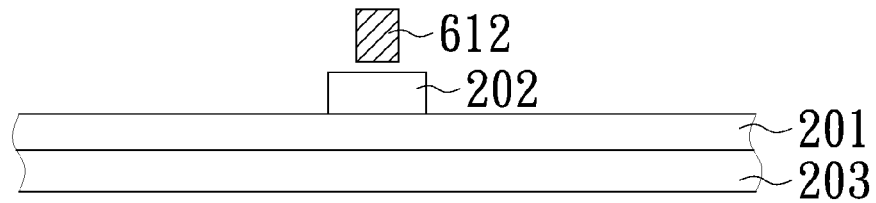
FIG. 7 is a schematic cross-sectional view illustrating another exemplary bridge structure for a germanium MOSFET.

FIG. 7 is a schematic cross-sectional view illustrating another exemplary bridge structure for a germanium MOSFET. FIG. 7 is a schematic cross-sectional view illustrating the structure taken along the same viewpoint as FIG. 6. The channel region block 612 has a cross section with a specified profile, and the channel region block 412 is floated over the monocrystalline silicon layer 202. In this embodiment, the specified profile has a rectangular shape.

Figure 8:
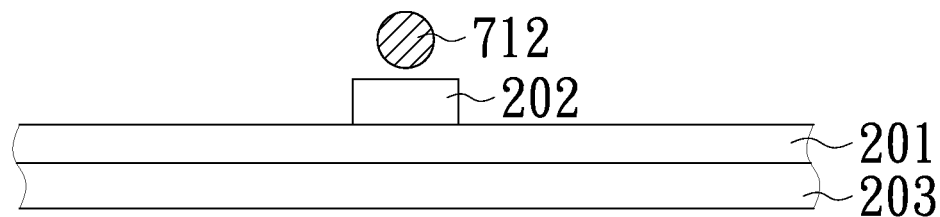
FIG. 8 is a schematic cross-sectional view illustrating a further exemplary bridge structure for a germanium MOSFET.

FIG. 8 is a schematic cross-sectional view illustrating a further exemplary bridge structure for a germanium MOSFET. FIG. 8 is a schematic cross-sectional view illustrating the structure taken along the same viewpoint as FIG. 6. The channel region block 712 has a cross section with a specified profile, and the channel region block 712 is floated over the monocrystalline silicon layer 202. In this embodiment, the specified profile has a circular shape.

Figure 9:
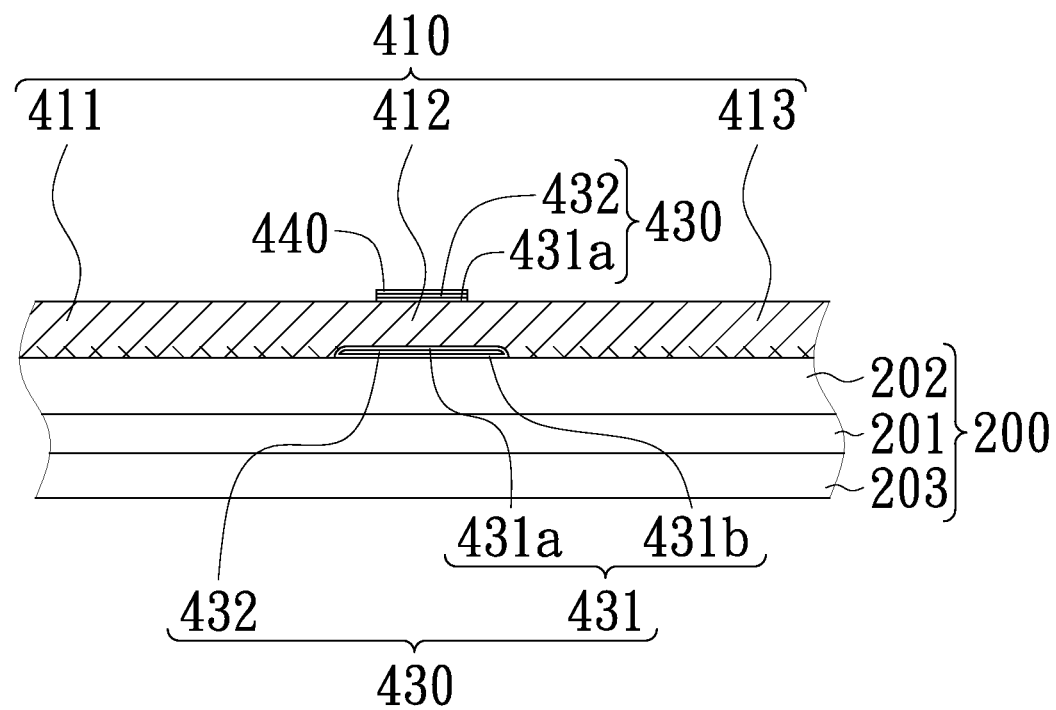
FIG. 9 is a schematic cross-sectional view illustrating a variant of the bridge structure as shown in FIG. 5.

FIG. 9 is a schematic cross-sectional view illustrating a variant of the bridge structure as shown in FIG. 5. The bridge structure further comprises an insulation structure 430 for covering the channel region block 412 and a conductive material layer 440 for covering the insulation structure 430. In this embodiment, the insulation structure 430 comprises a first insulation layer 431 and a second insulation layer 432. The first insulation layer 231 comprises a germanium dioxide layer 431a and a silicon dioxide layer 431b. The second insulation layer 232 is an aluminum oxide ($Al_2O_3$) layer. The conductive material layer 440 is a titanium nitride (TiN) layer.

From the above description, the bridge structure fabricating method of the present invention is effective to fabricate a bridge structure over the semiconductor substrate with at least one different material. As a consequence, a semiconductor device with a nearly non-defective structure and a good electric property can be produced. The semiconductor device is for example a fin-gate MOSFET, a gate-all-around MOSFET or a nano-wire MOSFET. Because of the bridge structure of the present invention, the response speed of the semiconductor device is increased and the junction leakage current is reduced. Furthermore, since the fabricating cost and the size are both reduced, the semiconductor device of the present invention can meet the demands of the semiconductor device of the new-generation electronic product.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A bridge structure for use in a semiconductor device, comprising:
    a semiconductor substrate; and
    a semiconductor structure layer formed on a surface of the semiconductor substrate and a lattice difference formed between the semiconductor structure layer and the semiconductor substrate, the semiconductor structure layer comprising at least a first block, at least a second block and at least a third block, wherein the first block and the third block are bonded on the surface of the semiconductor substrate, and the second block is floated over the semiconductor substrate and connected with the first block and the third block, wherein the semiconductor structure layer is an epitaxial layer.

2. The bridge structure according to claim 1, wherein the semiconductor substrate is a silicon substrate.

3. The bridge structure according to claim 2, wherein the silicon substrate comprises a silicon oxide layer.

4. The bridge structure according to claim 1, wherein the second block has a cross section with a specified profile floated over the semiconductor substrate, and the cross section is perpendicular to an axial direction of the second block connected with the first block and the third block.

5. The bridge structure according to claim 4, wherein the specified profile has a width in parallel with the surface of the semiconductor substrate, wherein from a top to a bottom of the specified profile, the width is gradually decreased.

6. The bridge structure according to claim 4, wherein the specified profile is a rectangular shape.

7. The bridge structure according to claim 4, wherein the specified profile is a circular shape.

8. The bridge structure according to claim 4, wherein a length of the cross section perpendicular to the axial direction is smaller than 50 nm.

9. The bridge structure according to claim 1, further comprising:
    an insulation structure, covering the bridge structure;
    a conductive material layer, covering the insulation structure; and
    a doped region, formed in the first block and the third block.

10. The bridge structure according to claim 9, wherein the insulation structure comprises a first insulation layer covering the second block; and a second insulation layer covering the first insulation layer.

11. A bridge structure for a semiconductor device, the bridge structure comprising:
    a silicon substrate; and
    a germanium structure divided into a first block, a second block and a third block, wherein the first block and the third block are bonded on a surface of the silicon substrate, and the second block is floated over the silicon substrate and connected with the first block and the third block.

12. The bridge structure according to claim 11, wherein a sidewall of the second block has a {111} germanium crystallographic surface.

13. The bridge structure according to claim 11, wherein the second block has a cross section with a specified profile floated over the silicon substrate, and the cross section is perpendicular to an axial direction of the second block connected with the first block and the third block.

14. The bridge structure according to claim 13, wherein the specified profile has a width is in parallel with the surface of the silicon substrate, wherein from a top to a bottom of the specified profile, the width is gradually decreased.

15. The bridge structure according to claim 13, wherein a length of the cross section perpendicular to a surface of the silicon substrate is smaller than 50 nm.

16. The bridge structure according to claim 13, wherein the specified profile is a circular shape.

17. The bridge structure according to claim 11, further comprising:
    an insulation structure covering the second block; and
    a conductive material layer covering the insulation structure.

18. The bridge structure according to claim 17, wherein the insulation structure comprises a first insulation layer and a second insulation layer.

19. The bridge structure according to claim 18, wherein the first insulation layer is composed of a germanium dioxide ($GeO_2$) layer and a silicon dioxide ($SiO_2$) layer, the second insulation layer is an aluminum oxide ($Al_2O_3$) layer, and the conductive material layer is a titanium nitride (TiN) layer.

20. A semiconductor device structure, comprising:
    a semiconductor substrate; and
    a semiconductor structure layer formed on a surface of the semiconductor substrate and a lattice difference formed between the semiconductor structure layer and the semiconductor substrate, the semiconductor structure layer comprising:
        at least a first block bonded on the surface of the semiconductor substrate;
        at least a second block having a cross section with a specified profile floated over the silicon substrate; and
        at least a third block bonded on the surface of the semiconductor substrate, wherein the second block is connected with the first block and the third block, the specified profile of the cross section, which is perpendicular to an axial direction of the second block connected with the first block and the third block, is gradually decreased from top to bottom, and a length of the cross section perpendicular to a surface of the silicon substrate is smaller than 50 nm.

* * * * *